(12) United States Patent
Veillette

(10) Patent No.: US 6,577,262 B1
(45) Date of Patent: Jun. 10, 2003

(54) COMPANDER FOR POWER CONTROL IN A BALLAST

(75) Inventor: Benoit R. Veillette, Mt. Kisco, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/469,323

(22) Filed: Dec. 22, 1999

(51) Int. Cl.$^7$ ................................................. H03M 1/12
(52) U.S. Cl. ....................................... 341/155; 341/106
(58) Field of Search .......................... 341/106, 67, 155, 341/61, 110; 324/613; 315/307, 276

(56) References Cited

U.S. PATENT DOCUMENTS

| | | | |
|---|---|---|---|
| 4,903,020 A | 2/1990 | Wermuth et al. | ............ 341/106 |
| 4,940,947 A | 7/1990 | McCartney et al. | ......... 324/613 |
| 5,023,490 A | 6/1991 | Gittinger | ..................... 307/492 |
| 5,760,730 A | 6/1998 | Fischer et al. | ............... 341/161 |
| 6,072,282 A | * 6/2000 | Adamson | ..................... 315/276 |
| 6,137,240 A | * 10/2000 | Bogdan | ........................ 315/307 |

FOREIGN PATENT DOCUMENTS

| | | | |
|---|---|---|---|
| DE | 4409063 C1 | 8/1995 | ............ H03M/1/12 |

OTHER PUBLICATIONS

"Externally Linear, Time–Invariant Systems and their Application to Companding Signal Processors", by Yannie Tsividis, IEEE Transactions on Circuits and Systems II, vol. 44, Feb. 1997, pp. 65–85.

"Digital Telephony", Wiley Series in Telecommunications, by John Bellamy, 1990, pp. 108–115.

Kari Kalliojarvi et al, "Novel Floating–point A/D– and D/A–Conversion Methods", International Symposium on Circuits and Systems. (ISCAS), US, New York, IEEE, May 1994, pp. 1–4, XP000593000.

Patent Abstracts of Japan, vol. 018, No. 486, (E–1604), Sep. 1994, & JP06164390 A (Roland Corp), Jun. 1994, Abstract, Figure 2.

* cited by examiner

*Primary Examiner*—Jean Bruner Jeanglaude

(57) ABSTRACT

A system and method for the dynamic power control of a ballast, wherein a compander is used to reduce dynamic input range requirements of an analog-to-digital converter (ADC) in power systems having dynamic signal ranges that are several orders of magnitude smaller than the largest signal being sampled. The present invention compresses an analog power signal and then digitizes and expands the signal to attain a digitized signal having an amplitude identical to the analog signal, thereby providing a power control system that is less expensive and less complicated than conventional power systems. The present invention can use algorithms to calculate both the expansion values and correction values required for a power control circuit to adjust an output power level toward a desired value.

24 Claims, 2 Drawing Sheets

COMPANDER FOR POWER CONTROL IN A BALLAST

FIELD OF THE INVENTION

The present invention pertains to the field of electronic power control circuits, and more specifically to dynamic power controls used in ballasts employed in lighting systems.

BACKGROUND OF THE INVENTION

Conventional electronic power control systems typically employ a closed-loop feedback architecture. Certain of these systems, such as digital power control systems, use an analog-to-digital converter (ADC) which digitizes a Signal provided by a power output sensing means. Digitized data values from the ADC are presented to a digital signal processor (DSP), and when deviations are sensed in the ADC output relative to a reference signal, the DSP causes corrective actions to be taken in the drive circuitry to adjust the output to a desired value. To correctly monitor precise changes in a low amplitude signal, a sensing ADC must necessarily have a high bit resolution.

A problem arises, however, when precision control is required for a time varying signal that is several orders of magnitude smaller than the largest signal to be detected. Specifically, for a system to be able to linearly maintain precise sensing of a small signal and also be able to sense large signals requires the use of expensive ADCs or extra controllable gain stages. Conventional methods used to address this problem either limit the dynamic range of the signal or limit the precision of the error detection, both of which degrade the performance of the power system.

In non-power systems applications, such as telephony systems and filters, the aforementioned problem has been addressed using companding in which the amplitude of an analog signal is compressed and the signal is then digitized. The digitized signal is then expanded such that the amplitude of the resulting digital signal is equal to the amplitude of the analog signal, thus making the analog-to-digital conversion transparent to the system. An analog compression technique which uses logarithms is particularly suited to a reduction in the dynamic range of a signal to a more manageable range that can then be sampled with a less expensive, lower bit resolution ADCs. See Y. Tsividia, "External Linear Time-Variant Systems and Their Applications to Companding Signal Processors," IEEE Transactions Circ. Syst. II, Vol. 44, pp. 65–85, February 1997; J. Bellamy, *Digital Telephony,* Wiley Series in Telecommunications, Edition 1990, pp. 108–115. See also U.S. Pat. No. 4,903,020 to Wermuth, et al., and U.S. Pat. No. 5,023,490 to Gittinger. To date companding has not been used in power system applications. Accordingly, it is an objective of the present invention to use companding in power systems.

SUMMARY OF THE INVENTION

A system and method for the dynamic power control of a ballast, wherein a compander is used to reduce the dynamic input range requirements of an analog-to-digital converter (ADC) in power systems having a dynamic signal range that is several orders of magnitude smaller than the largest signal being sampled. The compander is comprised of: an analog compressor to create a reduced-amplitude analog signal from an uncompressed analog signal; a sampling ADC to convert each one of the plurality of signal samples of the compressed analog signal to a digital data value; and a data expander to digitally expand the digital data value to an amplitude identical to the amplitude of the uncompressed analog signal.

An algorithm is then used to calculate a correction signal from the expanded digital data values. The correction signal causes a power feedback control circuit (not shown) to adjust the output power level of the load device (e.g. a discharge lamp) to a desired value. The control circuit can be implemented to control either an output current or an output voltage and provides a lower cost and less complex power control system than conventional prior art systems used for such purposes.

DETAILED DESCRIPTION OF THE DRAWINGS

Figure 1:
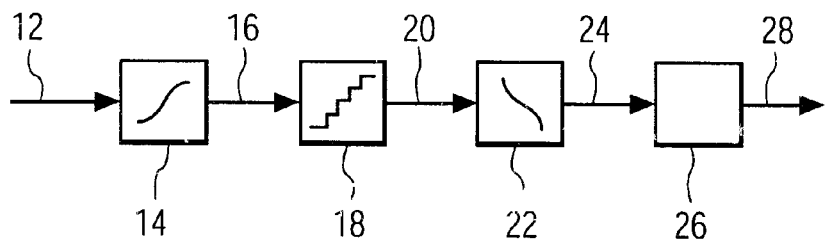
FIG. 1 shows an exemplary embodiment of a compander according to the present invention.

The present invention is for a system and method for using a compander for power control in a ballast. FIG. 1 shows an exemplary embodiment of a compander 10 according to the present invention. An analog input signal 12 derived from a power signal is input to an analog compressor 14. The amplitude-compressed analog output 16 of compressor 14 is then sampled by analog-to-digital converter (ADC) 18 which outputs a digitally-encoded signal 20 which is input to a digital expansion block 22.

Expansion block 22 expands data signal 20 in the digital domain to create a digital data signal 24 which is identical in amplitude to that of input signal 12. Expansion block 22 is comprised of a memory device having a look-up table (LUT) in which are stored a plurality of digital data values, each value being identical in amplitude to one of the plurality of signal amplitudes of analog input signal 12. Each one of a plurality of data values in data signal 20 corresponds to a unique address in the LUT to locate a unique one of the plurality of digital data values which generates a digital signal 24.

Signal 24 is processed by a digital computing device 26, such as a digital signal processor (DSP) or a microprocessor. Digital computing device 26 calculates a corrective signal 28 which is based on an error value associated with the magnitude of signal 24 relative to a reference value within the operating program of digital computing device 26. Corrective signal 28 supplies an appropriate movement to an actuator (not shown) to cause signal 12 to move to a new desired value. Expansion block 22 can also be incorporated within digital computing device 26 as a memory look-up table, the values of which are generated by a mathematical expression or by a piece-wise linear approximation algorithm.

Compander 10 can be used to compand either a sensed voltage or a sensed current signal. In an exemplary compressor for a load current the transfer function for conduction through a diode creates a logarithmic voltage response across that diode whose operation is described by the equation $$V_D = mV_T \log\left(\frac{I_D}{I_0} + 1\right) \quad (1)$$

where $V_D$ is the voltage (v) across the diode, m is a junction constant (1<m<2), $V_T$ is a thermal voltage (0.025 v @ 25° C.), $I_D$ is a current in amperes (amps) conducted through the diode, and $I_0$ is a saturation current (amps).

Figure 2:
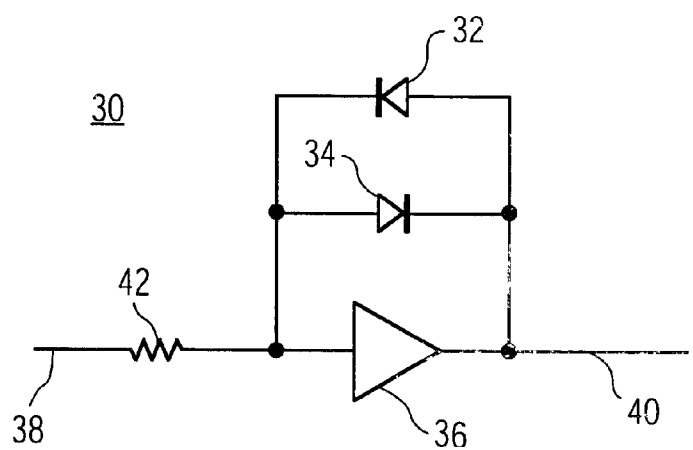
FIG. 2 shows a circuit diagram of an exemplary embodiment of the voltage signal compressor according to the present invention.

FIG. 2 shows an exemplary circuit 30 of a voltage signal compressor. Logarithmic transfer characteristics associated with diodes 32 and 34 across operational amplifier 36 provide the compression of an input voltage 38 to obtain compressed output voltage 40. Resistor 42 provides a linear control for the slope of the transfer characteristics. Various alternative configurations can be used to compress either current or voltage or both voltage and current simultaneously, as are known to those skilled in the art.

Figure 3A:
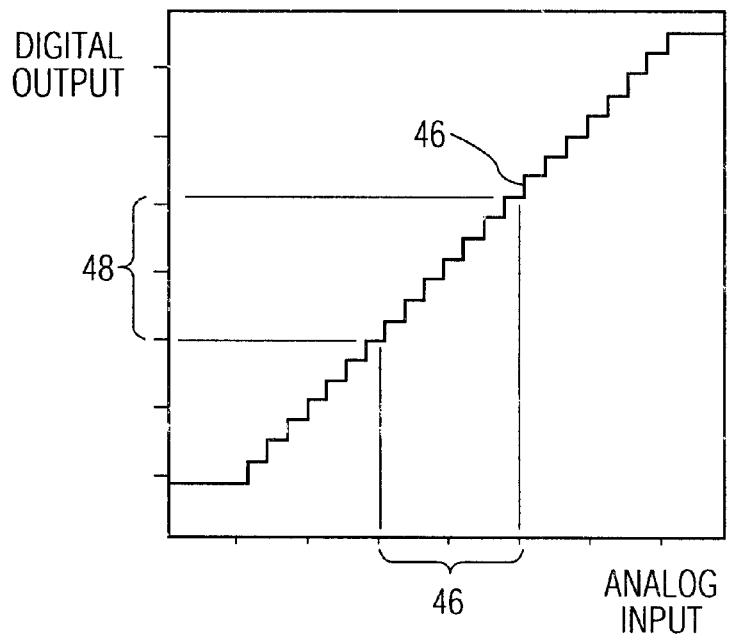
FIG. 3a shows a plot of the digital output voltage in volts (v) as a function of analog input voltage (v) of a high resolution ADC in response to an uncompressed electrical signal of the prior art.

FIG. 3a shows a plot of the digital output voltage (v) as a function of analog input voltage (v) for a conventional high resolution ADC in response to an uncompressed electrical signal of the prior art. Transfer curve 44 shows that in the absence of compression, for each linear step increase in analog input voltage signal 12 shown in FIG. 1, a corresponding step is made in the digital output voltage of the ADC. For an exemplary analog input variation 46, the digital output voltage varies by a proportional amount 48.

Figure 3B:
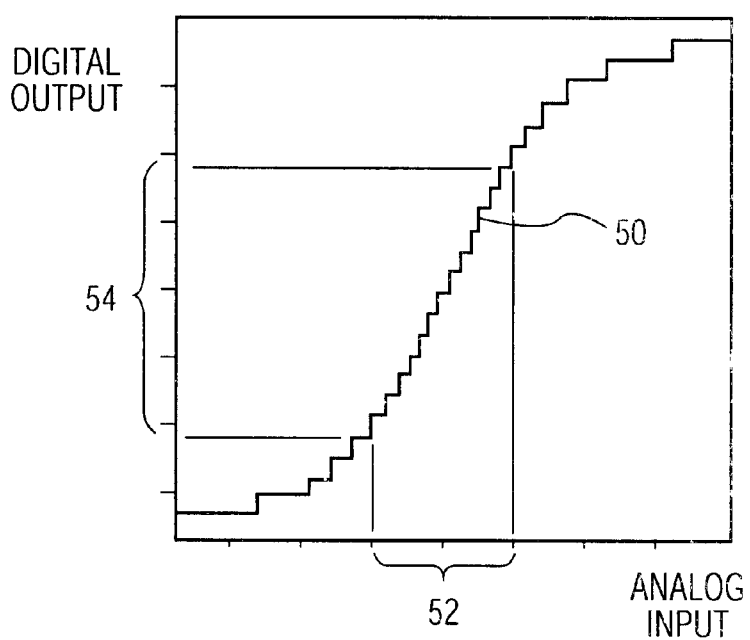
FIG. 3b shows a plot of the digital output voltage (v) as a function of analog input voltage (v) of a high resolution ADC in response to an amplitude-compressed electrical signal according to the present invention.

FIG. 3b shows a plot of the digital output voltage (v) as a function of analog input voltage (v) of a high resolution ADC in response to an amplitude-compressed electrical signal according to the present invention. Transfer curve 50 shows that for each linear step increase in analog input voltage signal 12 shown in FIG. 1, the effects of compression cause a larger step for small signals to be made in the digital output voltage than that of FIG. 3a.

Thus, if it is assumed that an analog input variation 52 shown in FIG. 3b is of the same magnitude as the analog input variation 46 shown in FIG. 3a, the digital output variation 54 shown in FIG. 3b is significantly greater than digital output variation 48 shown in FIG. 3a. Conversely, a given digital output variation of an ADC can be made to occur with much smaller variations of the input voltage of a compressed analog signal than that of an uncompressed signal, and the number of bits of the ADC can be reduced over that of an uncompressed signal.

Consequently, power controls that heretofore required a high resolution and a wide dynamic range ADC, can be implemented with a compander which incorporates an analog compression mechanism and an ADC having a lower bit resolution over the same dynamic range. This results in power control systems that are less expensive and less complicated than conventional systems.

Numerous modifications to the alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the claims is reserved.

What is claimed is:

1. A system for dynamic power control, comprising:
an analog electrical signal sensing means;
a companding means coupled to the analog sensing means and which includes, in cascade,
an analog signal compression means, an analog-to-digital converter (ADC), and a digital signal expansion means;
a correction signal calculating means; and
an electrical signal correcting means.

2. The system according to claim 1, wherein the analog signal compression means comprises a circuit that increases an amplitude of a small analog signal and reduces an amplitude of a large analog signal.

3. The system according to claim 1, wherein the electrical signal correcting means is responsive to a correction signal from the correction signal calculating means in order to regulate the output power level of a load controlled by the dynamic power control system.

4. The system according to claim 1, wherein the analog signal compression means is comprised of a plurality of diodes coupled to an operational amplifier.

5. The system according to claim 1, wherein the digital signal expansion means is comprised of a circuit for converting a compressed digital data signal from the ADC into an expanded digital data signal having an amplitude identical to an amplitude of a signal from the analog sensing means.

6. The system according to claim 1, wherein the digital signal expansion means is comprised of a memory device having a look-up table in which a plurality of expanded digital data values are stored, each digital data value being identical to an amplitude of a signal from the analog sensing means.

7. The system according to claim 6, wherein a digital output signal from the ADC corresponds to a unique one of a plurality of locations in the memory device in which is stored a corresponding expanded digital data value.

8. The system according to claim 1, wherein the digital signal expansion means comprises a digital signal processor having a lookup table.

9. The system according to claim 1, wherein the digital signal expansion means comprises a microprocessor having a lookup table.

10. The system according to claim 1, wherein the digital signal expansion means includes a digital computing device having a linear approximation algorithm stored therein.

11. The system according to claim 10, wherein the digital computing device is a microprocessor.

12. The system according to claim 10, wherein the digital computing device is a digital signal processor (DSP).

13. The system according to claim 1, wherein the electrical signal to be sensed and corrected is a current.

14. The system according to claim 1, wherein the electrical signal to be sensed and corrected is a voltage and the electrical signal correcting means is responsive to a correction signal from the correction signal calculating means in order to regulate the output power level of a load controlled by the dynamic power control system.

15. The system according to claim 1, wherein the electrical signal to be sensed and corrected is a current and a voltage.

16. The system according to claim 1, wherein the correction signal calculating means comprises an algorithm in a digital computing device.

17. The system according to claim 16, wherein the digital computing device is a digital signal processor (DSP).

18. The system according to claim 16, wherein the digital computing device is a microprocessor.

19. The dynamic power control system according to claim 1 wherein the analog to digital converter samples output signal of the analog signal compression means and the compounding means reduces the dynamic input range requirements of the analog to digital converter for a power control system having a dynamic signal range at least an order of magnitude smaller than the largest signal sampled.

20. The dynamic power control system according to claim 1 wherein the electrical signal correcting means is part of a ballast control circuit for an electric discharge lamp and is responsive to a correction signal from the correction signal calculating means in order to regulate the output power level of the discharge lamp to a desired value.

21. The dynamic power control system according to claim 20 wherein the power control system is adapted to process a sensed analog time varying signal over a dynamic range between lowest and highest signal magnitude values where the lowest signal magnitude value is several orders of magnitude lower than the highest signal magnitude value.

22. A method in a dynamic power control system for expanding each one of a plurality of encoded digital data words from the output of an analog-to-digital converter, comprising the steps of:

inputting an encoded data word into a digital computing device having a look-up table in which are stored a plurality of associated expanded digital data values;

using a binary value of the encoded data word to calculate an offset into the look-up table;

retrieving the digital data value stored at the offset; and transferring the retrieved digital data value to an output node.

23. The method according to claim 22, wherein each one of the plurality of encoded data words comprises a data value that is identical to an output of an analog-to-digital conversion of a plurality of analog voltage signals that have been compressed in amplitude.

24. The method according to claim 22, wherein each one of the plurality of encoded data words comprises a data value that is identical to an output of an analog-to-digital conversion of a plurality of analog current signals which have been compressed in amplitude.

* * * * *